(12) United States Patent
Watanabe et al.

(10) Patent No.: US 11,367,814 B2
(45) Date of Patent: Jun. 21, 2022

(54) LED LIGHT-SOURCE SUBSTRATE AND ILLUMINATION DEVICE

(71) Applicant: SHARP KABUSHIKI KAISHA, Sakai (JP)

(72) Inventors: Hisashi Watanabe, Sakai (JP); Takeshi Masuda, Sakai (JP); Hirotoshi Yasunaga, Sakai (JP); Youzou Kyoukane, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 288 days.

(21) Appl. No.: 16/855,577

(22) Filed: Apr. 22, 2020

(65) Prior Publication Data

US 2020/0343406 A1 Oct. 29, 2020

(30) Foreign Application Priority Data

Apr. 26, 2019 (JP) .............................. JP2019-086592

(51) Int. Cl.
- *H01L 33/56* (2010.01)
- *H01L 33/60* (2010.01)
- *H01L 27/15* (2006.01)
- *H01L 33/54* (2010.01)

(52) U.S. Cl.
CPC ............ *H01L 33/56* (2013.01); *H01L 27/156* (2013.01); *H01L 33/54* (2013.01); *H01L 33/60* (2013.01)

(58) Field of Classification Search
CPC ... H01L 27/156; H01L 25/0753; H01L 33/52; H01L 33/54; H01L 33/56; H01L 33/60
See application file for complete search history.

(56) References Cited

U.S. PATENT DOCUMENTS

| | | | |
|---|---|---|---|
| 2013/0063939 A1* | 3/2013 | Kondo | H01L 33/52 362/267 |
| 2013/0092974 A1* | 4/2013 | Kimura | C08J 5/18 257/E33.059 |
| 2013/0234187 A1* | 9/2013 | Ebe | H01L 33/50 428/354 |

FOREIGN PATENT DOCUMENTS

| | | |
|---|---|---|
| JP | 2007-053352 A | 3/2007 |
| WO | 2007/011068 A1 | 1/2007 |

\* cited by examiner

*Primary Examiner* — Robert G Bachner
*Assistant Examiner* — Molly K Reida
(74) *Attorney, Agent, or Firm* — ScienBiziP, P.C.

(57) ABSTRACT

An LED light-source substrate includes a first bonding sheet covering the LED, a second bonding sheet formed on the first bonding sheet, and a reflective layer formed on the second bonding sheet to suppress light from the LED. The second bonding sheet is bonded peelably from the first bonding sheet.

16 Claims, 9 Drawing Sheets

LED LIGHT-SOURCE SUBSTRATE AND ILLUMINATION DEVICE

CROSS-REFERENCE TO RELATED APPLICATION

This application claims the benefit of priority to Japanese Patent Application Number 2019-086592 filed on Apr. 26, 2019. The entire contents of the above-identified application are hereby incorporated by reference.

BACKGROUND OF THE INVENTION

1. Field of the Invention

The disclosure relates to a light emitting diode (LED) light-source substrate including an LED of a flip-chip type.

2. Description of the Related Art

There are known various types of light sources of illumination devices attached to display devices and the like, such light sources including a light source that uses a light emitting diode (LED). In the related art, surface-mounted LEDs are used in direct-lighting type illumination devices in which a light source is disposed directly below the display panel. As a light-source substrate having an LED mounted thereon, there is known an LED light-source substrate in which a plurality of LEDs are mounted on the same circuit substrate, and in which a mold resin is extended over the plurality of LEDs, with the mold resin covering the plurality of LEDs. A white ink based reflective layer is formed directly above the LEDs provided to this LED light-source substrate (JP 2007-53352 A, Mar. 1, 2007).

SUMMARY OF THE INVENTION

When a mistake occurs during formation of the reflective layer that is directly above the LEDs described above, it is desirable that, rather than discard the LED light-source substrate having thereabove the reflective layer, in which the mistake occurred during formation, the reflective layer be reworked since the LED light-source substrate is expensive. Such rework involves peeling the reflective layer, in which the mistake occurred during formation, from the mold resin and suitably forming a reflective layer once again.

Nevertheless, with the reflective layer being formed using white ink or the like by a method such as printing directly on the surface of the mold resin, the reflective layer needs to be physically scraped away from the mold resin in order to peel away the reflective layer, or washed using a special solution to clean the LED light-source substrate in order to remove the reflective layer from the mold resin, making it difficult to neatly restore the LED light-source substrate without impairing the substrate.

Accordingly, the problem arises that rework is difficult when a mistake occurs in the formation of the reflective layer on the resin directly above the LED.

An aspect of the disclosure is to provide an LED light-source substrate that can be easily reworked when a mistake occurs in formation of a reflective layer on a resin directly above an LED.

(1) According to an embodiment of the disclosure, an LED light-source substrate includes a substrate, an LED of a flip-chip type that is mounted on the substrate, a first bonding sheet having transmissivity and formed on the substrate and moreover covering the LED, a second bonding sheet having transmissivity and formed on the first bonding sheet, and a reflective layer formed on the second bonding sheet to suppress light emitted from the LED in a direction orthogonal to the substrate. The second bonding sheet is bonded peelably from the first bonding sheet.

(2) Further, according to an embodiment of the disclosure, in addition to the configuration of (1) described above, in the LED light-source substrate, the LED is a bare chip.

(3) Further, according to an embodiment of the disclosure, in addition to the configuration of (1) described above, in the LED light-source substrate, an adhesive strength of the second bonding sheet relative to the first bonding sheet is weaker than an adhesive strength of the first bonding sheet relative to the substrate.

(4) Further, according to an embodiment of the disclosure, in addition to the configuration of (1) described above, in the LED light-source substrate, the first bonding sheet includes a peeling layer formed on the second bonding sheet side thereof to make the second bonding sheet peelable from the first bonding sheet.

(5) Further, according to an embodiment of the disclosure, in addition to the configuration of (1) described above, in the LED light-source substrate, the first bonding sheet and the second bonding sheet each have a convex shape corresponding to a mounted position of the LED.

(6) Further, according to an embodiment of the disclosure, in addition to the configuration of (1) described above, in the LED light-source substrate, the first bonding sheet includes a first resin layer formed on the substrate and covering the LED, and a first base material formed on the first resin layer, and the second bonding sheet includes a second resin layer formed on the first base material and a second base material formed on the second resin layer.

(7) Further, according to an embodiment of the disclosure, in addition to the configuration of (6) described above, in the LED light-source substrate, the first resin layer and the second resin layer each include an adhesive layer.

(8) Further, according to an embodiment of the disclosure, in the configuration of (6) described above, in the LED light-source substrate, the first resin layer and the second resin layer each have a haze of 30% or less.

(9) Further, according to an embodiment of the disclosure, in addition to the configuration of (6) described above, in the LED light-source substrate, the first resin layer and the second resin layer each have a refractive index greater than 1.

(10) Further, according to an embodiment of the disclosure, in addition to the configuration of (6) described above, in the LED light-source substrate, the first resin layer includes at least one of an acrylic-based material, an epoxy-based material, and a urethane-based material, and the second resin layer includes a silicone-based material.

(11) Further, according to an embodiment of the disclosure, in addition to the configuration of (6) described above, in the LED light-source substrate, the second resin layer has an adhesive strength of 5 N/cm or less.

(12) Further, according to an embodiment of the disclosure, in addition to the configuration of (1) described above, in the LED light-source substrate, the reflective layer has dimensions greater than or equal to two times and less than or equal to 10 times dimensions of the LED.

(13) Further, according to an embodiment of the disclosure, in addition to the configuration of (1) described above, in the LED light-source substrate, the reflective layer has a circular shape, and a central axis of the reflective layer is disposed at a position corresponding to a central axis of the LED.

(14) Further, according to an embodiment of the disclosure, in addition to the configuration of (6) described above, in the LED light-source substrate, the first resin layer has a thickness greater than a thickness of the LED.

(15) Further, according to an embodiment of the disclosure, in addition to the configuration of (5) described above, in the LED light-source substrate, the convex shape has a height approximately equal to a thickness of the LED.

(16) According to another aspect of the disclosure, an illumination device includes the LED light-source substrate described in any one of (1) to (15) described above.

According to an aspect of the disclosure, it is possible to easily rework a reflective layer when a mistake occurs in printing the reflective layer onto a resin directly above an LED.

BRIEF DESCRIPTION OF THE DRAWINGS

The disclosure will be described with reference to the accompanying drawings, wherein like numbers reference like elements.

DETAILED DESCRIPTION OF THE INVENTION

First Embodiment

Figure 1:
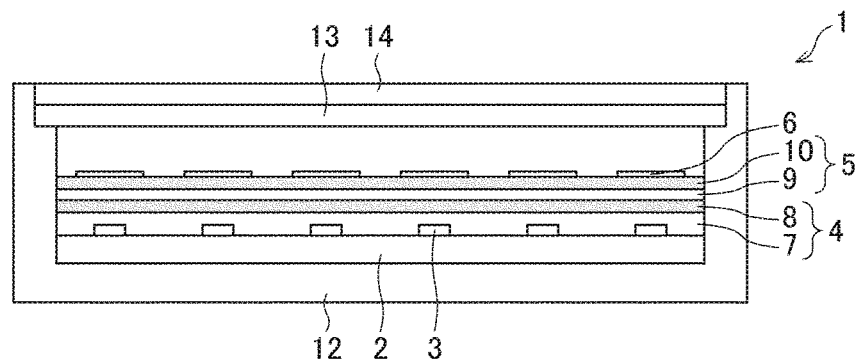
FIG. 1 is a cross-sectional view of an LED light-source substrate according to a first embodiment.

FIG. 1 is a cross-sectional view of a light emitting diode (LED) light-source substrate 1 according to the first embodiment. The LED light-source substrate 1 includes a substrate 2, an LED 3 of a flip-chip type that is mounted on the substrate 2, a first bonding sheet 4 having transmissivity and formed on the substrate 2 and moreover covering the LED 3, a second bonding sheet 5 having transmissivity and formed on the first bonding sheet 4, and a reflective layer 6 formed on the second bonding sheet 5 to suppress light emitted from the LED 3 in a direction orthogonal to the substrate 2. The second bonding sheet 5 is bonded peelably from the first bonding sheet 4.

An adhesive strength of the second bonding sheet 5 relative to the first bonding sheet 4 is weaker than an adhesive strength of the first bonding sheet 4 relative to the substrate 2.

The first bonding sheet 4 includes a first adhesive layer 7 (first resin layer) formed on the substrate 2 and covering the LED 3, and a first base material 8 formed on the first adhesive layer 7. The second bonding sheet 5 includes a second adhesive layer 9 (second resin layer) formed on the first base material 8 and a second base material 10 formed on the second adhesive layer 9.

Preferably, the first adhesive layer 7 and the second adhesive layer 9 each have a haze of 30% or less. Preferably, the first adhesive layer 7 and the second adhesive layer 9 each have a refractive index greater than 1.

Preferably, the first adhesive layer 7 includes at least one of an acrylic-based material, an epoxy-based material, and a urethane-based material. Preferably, the second adhesive layer 9 includes a silicone-based material. Preferably, the second adhesive layer 9 has an adhesive strength of 5 N/cm or less.

Preferably, the reflective layer 6 has dimensions greater than or equal to two times and less than or equal to 10 times dimensions of the LED 3. Then, preferably, the reflective layer 6 has a circular shape. Preferably, a central axis of the reflective layer 6 is disposed at a position corresponding to a central axis of the LED 3.

Preferably, the first adhesive layer 7 has a thickness greater than a thickness of the LED 3.

The LED 3 is an unpackaged bare chip. As the bare chip, luminescent color thereof is monochromatic and is typically blue. Or, the LEDs 3 having R, G, and B tri-colors may be arranged side-by-side. The element structure of the LED 3 is a flip-chip type to be described later, and the LED 3 is directly mounted, without being modified, to the substrate 2 as a bare chip by bumps or solder. While a bare chip is used as the LED 3 in the present embodiment, the LED is not limited thereto, and a similar effect can be obtained even when a packaged LED is used.

The substrate 2 is a general circuit substrate having, as the base material, glass epoxy, a polyimide, aluminum or the like. Typically, a plurality of the LEDs 3 are mounted at a specific interval in a matrix form. An electrode pad connected to the LED 3 is further connected to a power source by a cable or the like (not illustrated) through wiring formed on the substrate 2. Preferably, a specific electric current can be controlled and applied to each LED 3 from the power source. Preferably, a white coating (white resist: PSR-4000 manufactured by Taiyo Holdings co., Ltd., or the like) is provided on the electrode pad to increase light reflectivity.

The LED light source-substrate 1 includes a fluorescent sheet 13. The fluorescent sheet 13 absorbs the wavelength of light emitted from the LED 3 and emits light of a color that is complementary thereto, turning the color of the emission light to white. If the light emitted from the LED 3 is blue, the fluorescent sheet 13 is a fluorescent sheet obtained by dispersing a fluorescent material, which emits yellow, green, and red light, into a resin or the like. As a specific product of the fluorescent sheet 13, there is quantum dot enhancement film (QDEF) manufactured by 3M or the like. However, for instance, when three types of LEDs 3 respectively emitting the three primary colors, red (R), green (G), and blue (B) are disposed on the substrate 2, such a sheet is not needed as long as another method for whitening is available. When a packaged LED is used, white light emission can be achieved by adding phosphor to the sealing resin of the package.

The LED light-source substrate 1 further includes an optical sheet 14. The optical sheet 14 is an optical member for transforming the light, emitted from a point (LED 3), into a uniform surface light source, and a diffuser plate, a diffuser sheet, a prism sheet, a polarizing reflection sheet, and the like are used as necessary.

As for the diffuser plate, a Sumipex opal sheet manufactured by Sumitomo Chemical Company, Limited or the like is used for the optical sheet 14 to resolve unevenness. As for a diffuser sheet, D114 manufactured by Tsujiden Co. Ltd. or the like is used for the optical sheet 14 to resolve unevenness. As for a prism sheet, a brightness enhancement film (BEF) manufactured by 3M or the like is used for the optical sheet 14 to enhance brightness. As for a polarizing reflection sheet, a dual brightness enhancement film (DBEF) manufactured by 3M or the like is used for the optical sheet 14 to enhance brightness.

Further, when a dielectric mirror sheet designed to transmit light of a color emitted from the LED 3 and reflect light of a color complementary thereto is provided, brightness may increase.

The optical sheet 14 is typically a lamination including, in order, the LED, dielectric mirror sheet, fluorescence emission sheet, diffuser sheet, prism sheet, prism sheet, and polarizing reflection sheet.

The first bonding sheet 4 and the second bonding sheet 5 have distinctive features according to the present embodiment. The first bonding sheet 4 is obtained by forming the adhesive layer 7, having light transmissivity, on the base material 8 having light transmissivity, such as polyethylene terephthalate (PET), and is bonded to the LED mounted surface of the substrate 2 while air bubbles are extruded, with the soft adhesive layer 7 being deformed. The second bonding sheet 5 is obtained by forming the adhesive layer 9, having light transmissivity, on the base material 10 having light transmissivity, such as PET, and is bonded to the first bonding sheet 4 while air bubbles are extruded, with the soft adhesive layer 9 being deformed. The higher the refractive index of each of the adhesive layers 7, 9, the greater the effect of increasing the luminous efficiency of the LED 3. In the present embodiment, two sheets, namely the first bonding sheet 4 and the second bonding sheet 5, are layered.

The LED light-source substrate 1 further includes a frame 12. The frame 12 is a frame for holding an optical member, and is formed by molding using a resin or the like having a high reflectivity. A representative example of a resin having a high reflectivity is a white polycarbonate.

Figure 2A:
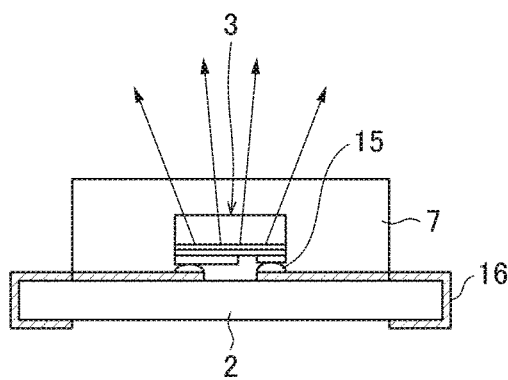
FIG. 2A is a cross-sectional view illustrating a mounted state of a flip-chip type LED provided to the LED light-source substrate.
Figure 2B:
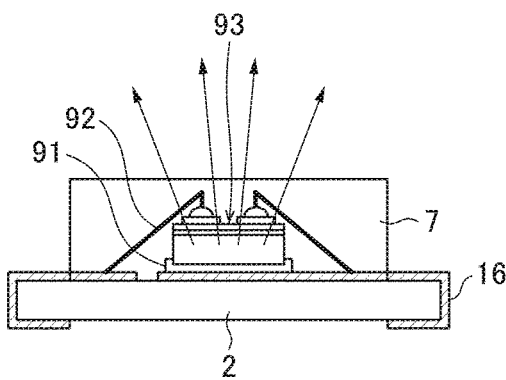
FIG. 2B is a cross-sectional view illustrating a mounted state of a face-up type LED.
Figure 2C:
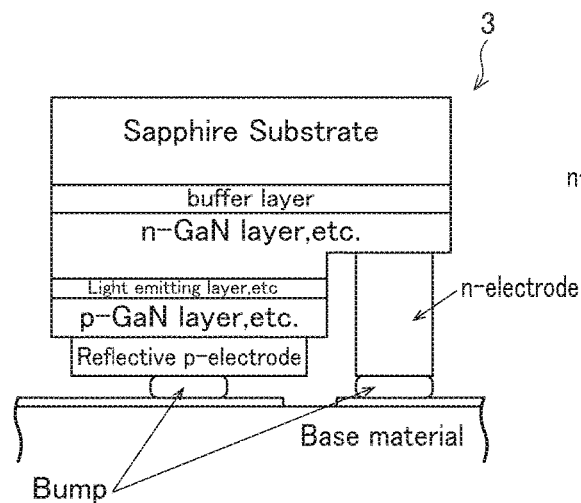
FIG. 2C is a cross-sectional view illustrating a configuration of the flip-chip type LED.
Figure 2D:
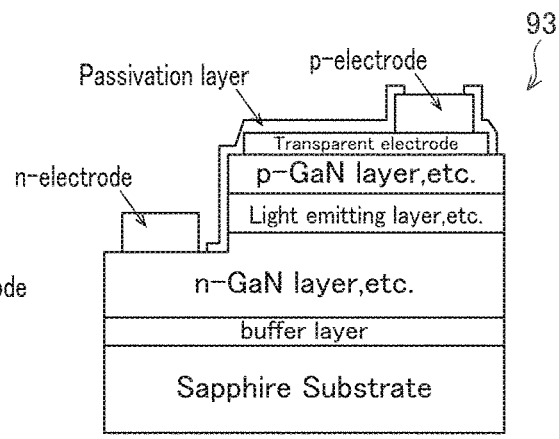
FIG. 2D is a cross-sectional view illustrating a configuration of the face-up type LED.

FIG. 2A is a cross-sectional view illustrating a mounted state of the LED 3 of a flip-chip type provided to the LED light-source substrate 1, FIG. 2B is a cross-sectional view illustrating a mounted state of an LED 93 of a face-up type, FIG. 2C is a cross-sectional view illustrating a configuration of the LED 3 of the flip-chip type, and FIG. 2D is a cross-sectional view illustrating a configuration of the LED 93 of the face-up type. Constituent elements similar to the constituent elements described above are given the same reference numerals, and detailed descriptions thereof are not repeated.

There are two types of LEDs: a face-up type and flip-chip type. The face-up type LED 93, as illustrated in FIG. 2B and FIG. 2D, has an electrode surface on an upper face thereof, and thus a wire bonding 92 is used for electrical connection to the substrate 2. The flip-chip type LED 3, as illustrated in FIG. 2A and FIG. 2C, has, an electrode surface on a lower face thereof, and thus can be directly mounted to the substrate 2 using gold bumps 15 and solder.

In the present embodiment, the first bonding sheet 4 provided with the first adhesive layer 7 is bonded from above the LED 3 to the substrate 2 and thus, in the case of the face-up type, the wire bonding 92 may interfere with the bonding, thereby causing air bubbles to enter the first adhesive layer 7, or the wire bonding 92 may break or come into contact with an undesired site, whereby a failure may be caused. Accordingly, in the present embodiment, the flip-chip type LED 3 is used.

Figure 3A:
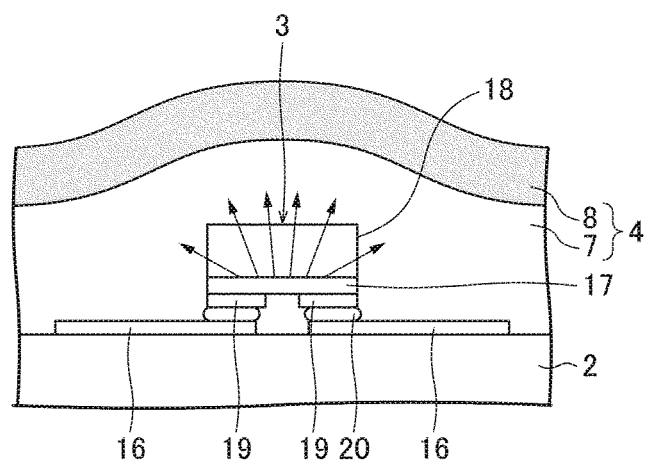
FIG. 3A is an enlarged cross-sectional view of an LED of the LED light-source substrate.
Figure 3B:
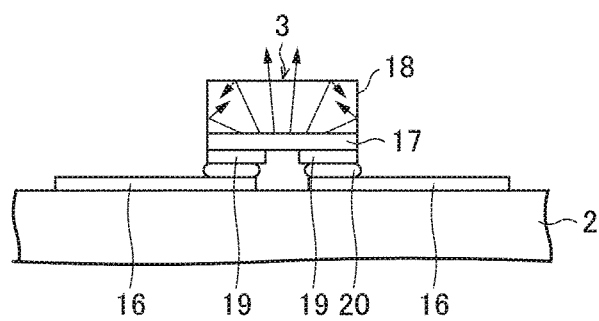
FIG. 3B is an enlarged cross-sectional view of an LED of an LED light-source substrate according to the comparative example.

FIG. 3A is an enlarged cross-sectional view of the LED 3 of the LED light-source substrate 1, and FIG. 3B is an enlarged cross-sectional view of the LED 3 of an LED light-source substrate according to the comparative example. Constituent elements similar to the constituent elements described above are given the same reference numerals, and detailed descriptions thereof are not repeated.

When the periphery of the LED 3 is an air layer, it is known that light emitted at a wide angle from the light emitting layer 17 of the LED 3 is totally reflected at an inner surface of a sapphire substrate 18, as illustrated in FIG. 3B, making it difficult for the light to emit from the LED 3, and thus decreasing the luminous efficiency of the LED 3.

On the other hand, when the refractive index of the periphery of the LED 3 is high, the light is no longer totally reflected on the inner surface of the sapphire substrate 18 in the chip interior, and thus luminous efficiency is improved. When the periphery of the LED 3 has a refractive index (n>1.75) particularly larger than that of the sapphire substrate 18, all light from the light-emitting layer 17 is emitted from the sapphire substrate 18 without being totally reflected at the inner surface of the sapphire substrate 18, and thus setting the refractive index to n>1.75 or greater is almost meaningless (strictly speaking, while such a setting is not completely meaningless since a GaN layer or the like having a higher refractive index is further present, but the layer is quite thin and thus effects elicited are limited). Even when n<1.75, the higher the refractive index, the greater the improvement in luminous efficiency. Therefore, the first adhesive layer 7 can be considered effective as long as the adhesive layer has a refractive index greater than at least that of air.

The LED 3 has a high temperature when turned on, and thus preferably the first adhesive layer 7 is an adhesive layer exhibiting little discoloration and the like even at high temperatures. Further, preferably the first adhesive layer 7 has high transparency from the perspective of increasing brightness.

The material of the first adhesive layer 7 that meets the above conditions most is a silicon-based adhesive (n=approximately 1.41). A silicon-based adhesive has excellent heat resistance and exhibits lower discoloration. A silicon-based adhesive has a slightly lower refractive index.

An acrylic-based adhesive (n=1.49) also has an extremely high transparency, although not as high as that of the silicon-based adhesive, and is therefore can be applied as the material of the first adhesive layer 7.

Note that with these materials being used as a base, dispersing metal oxide nanoparticles having a high refractive index, such as $TiO_2$ and $ZrO_2$, in the first adhesive layer 7, or introducing sulfur having a high atomic refraction to increase the refractive index of the first adhesive layer 7 makes it possible to significantly improve the luminous efficiency of the LED 3 and is thus particularly preferred.

Further, note that, naturally, the LED 3 has a very small area (for example, 0.1×0.2 mm or the like) and a connecting portion connected with the substrate 2, such as a solder 20, also has a small area and thus peeling from the substrate 2 may occur due to any impact, but according to the present embodiment, the base material 8 of the first bonding sheet 4 also serves to protect the LED 3, and this elicits an additional effect that the LED 3 is less likely to fail.

Figure 4A:
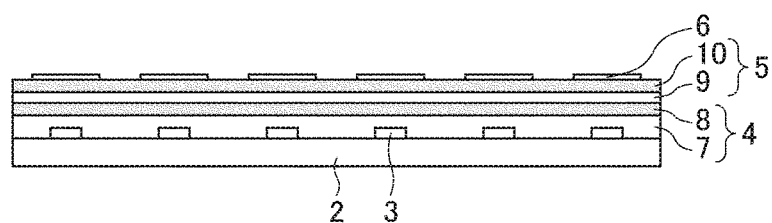
FIG. 4A is a cross-sectional view relating to a substrate, a first bonding sheet, a second bonding sheet, and a reflective layer of the LED light-source substrate.
Figure 4B:
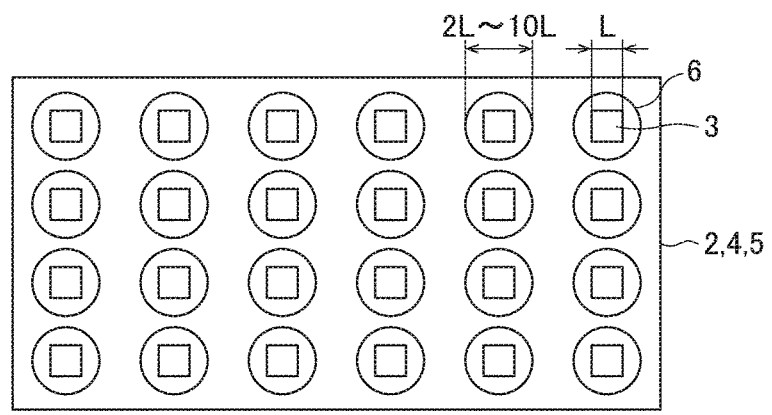
FIG. 4B is a top view thereof.

FIG. 4A is a cross-sectional view relating to the substrate 2, the first bonding sheet 4, the second bonding sheet 5, and the reflective layer 6 of the LED light-source substrate 1, and FIG. 4B is a top view thereof. Constituent elements similar to the constituent elements described above are given the same reference numerals, and detailed descriptions thereof are not repeated.

The first bonding sheet 4 is bonded on the substrate 2, and the second bonding sheet 5 is further bonded on the first bonding sheet 4. Then, the reflective layer 6 for suppressing light emitted from the LED 3 in a direction orthogonal to the substrate 2 is provided on the surface of the second bonding sheet 5 to be directly or nearly directly above the LED 3.

As the reflective layer 6, a white ink layer or a metal thin film having a high reflectivity and composed of silver, aluminum, or alloys thereof, is suitable. As a result, light having a strong intensity directly above the LED 3 can be reflected by the reflective layer 6 and mitigated, and thus the unevenness in brightness of the LED light-source substrate 1 is improved.

Preferably, the reflective layer 6 has a dimension somewhat larger than an outer diameter dimension of the LED 3, such that the light emitted from side surfaces of the LED 3 can be reflected as well. For example, as illustrated in FIG. 4B, when the dimension of one side of the LED 3 is L, the dimension of the reflective layer 6 is preferably greater than or equal to 2L and less than or equal to 10L.

A shape of the reflective layer 6 is typically circular, with a central axis of the LED 3 and a central axis of the circular shape of the reflective layer 6 coinciding, as illustrated in FIG. 4B. With such a configuration, light emitted in all directions from the LED 3 can be efficiently shielded.

As the method for forming the reflective layer 6, a method of printing white ink on the second bonding sheet 5 by using an inkjet printing machine is most efficient. Other printing methods such as screen printing may also be used. When the reflective layer 6 is a metal thin film, the reflective layer 6 can be formed using a vapor deposition or sputtering method using an aperture mask, or a method such as photolithography.

Figure 5A:
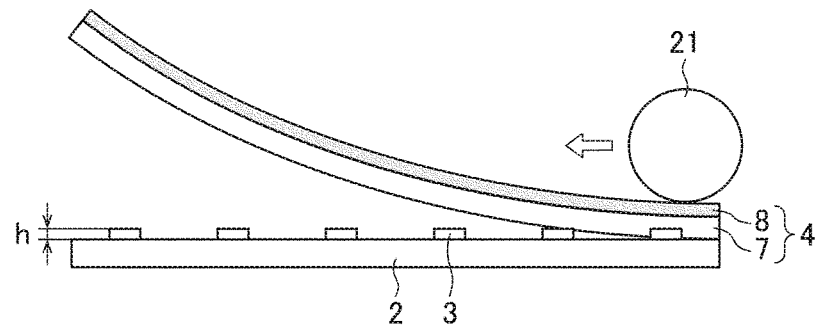
FIG. 5A is a cross-sectional view illustrating a method for forming the first bonding sheet.
Figure 5B:
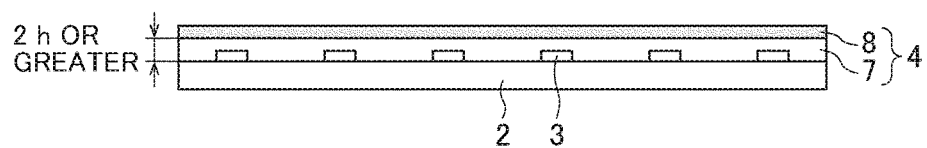
FIG. 5B is a cross-sectional view illustrating the first bonding sheet formed on the substrate.
Figure 5C:
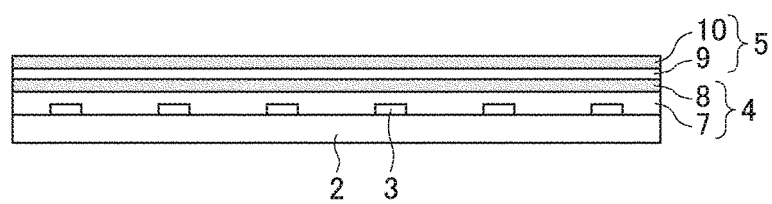
FIG. 5C is a cross-sectional view illustrating the second bonding sheet formed on the first bonding sheet.

FIG. 5A is a cross-sectional view illustrating a method for forming the first bonding sheet 4, FIG. 5B is a cross-sectional view illustrating the first bonding sheet 4 formed on the substrate 2, and FIG. 5C is a cross-sectional view illustrating the second bonding sheet 5 formed on the first bonding sheet 4. Constituent elements similar to the constituent elements described above are given the same reference numerals, and detailed descriptions thereof are not repeated.

As illustrated in FIG. 5A, the first bonding sheet 4, in which the first adhesive layer 7 having transmissivity is formed on the first base material 8 having transmissivity such as PET, is bonded to the substrate 2 on which the LED 3 is mounted by using a roller 21 or the like. This makes it possible to easily extrude the air at the periphery of the LED 3 and fill the periphery with the first adhesive layer 7. Even when some air bubbles remain in the periphery of the LED 3, the air bubbles can be eliminated by autoclaving. Autoclaving is performed under conditions include, for example, 45° C., 0.5 MPa, 20 minutes, and the like.

The first base material 8 is preferably a material having high transparency. Examples include PET, acrylic, polycarbonate, and the like. The material of the first adhesive layer 7 is preferably a material having favorable transparency and high adhesive strength relative to the surface of the substrate 2. For example, adhesive materials such as acrylic-based, epoxy-based, and urethane-based adhesive materials are preferred. The adhesive strength of the first adhesive layer 7 is preferably 10 N/cm or higher, for example.

The first adhesive layer 7, which is somewhat thick, is required to implement adhesion at the periphery of the LED 3 with no air interface. When the height of the LED 3 is h, and the thickness of the first adhesive layer 7 is h or less, air bubbles often remain in the space even when autoclaving is performed. When the thickness of the first adhesive layer 7 is greater than or equal to h and less than or equal to 2h, a surface shape of the first bonding sheet 4 is an uneven shape extending along the shape of the LED 3 (configuration of the third embodiment described later). When the thickness of the first adhesive layer 7 is 2h or greater, the surface shape of the first bonding sheet 4 is substantially flat. In embodiment 1, the thickness of the adhesive layer is 2h or greater, and thus the surface shape of the first bonding sheet 4 is substantially flat.

With such a configuration, the surface of the first bonding sheet 4 is flat, and thus the second bonding sheet 5 can be easily bonded to the first bonding sheet 4 without air bubbles by using only the roller 21 or the like (without autoclaving).

The thickness of the first adhesive layer 7 is not particularly limited in terms of an upper limit therefor. However, when the thickness is 2 mm or greater, for example, the thickness of the LED light-source substrate 1 serving as a backlight becomes thicker than necessary, and the cost of the first adhesive layer 7 increases, which is not preferable.

The second bonding sheet 5 can also be bonded by using the roller 21 or the like in the same manner as the first bonding sheet 4. The second bonding sheet 5 is also preferably a material having high transparency. Examples include PET, acrylic, polycarbonate, and the like. Preferably, the second bonding sheet 5, because of the possibility of being subsequently peeled, has a relatively weak adhesive strength relative to the first base material 8. The adhesive strength between the first base material 8 and the second adhesive layer 9 needs to be weaker than at least the adhesive strength between the surface of the substrate 2 and the first adhesive layer 7.

For example, the adhesive material of the second adhesive layer 9 can be made to have a low adhesive strength by, for example, applying a silicone-based material having a weak adhesive strength, with the material in itself having a weak adhesive strength, or thinly forming a film having a thickness such as 5 μm or less by using even an acrylic-based material, an epoxy-based material, an urethane-based material, or the like having a high adhesive strength. The adhesive strength of the second adhesive layer 9 is preferably, for example, 5 N/cm or less. That is, the adhesive strength of the second adhesive layer 9 is less than or equal to ½ of the adhesive strength of the first adhesive layer 7.

Figure 6A:
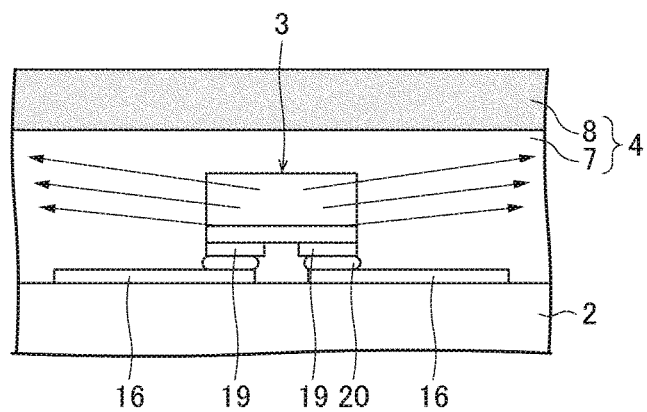
FIG. 6A is a cross-sectional view for describing an effect of a first adhesive layer provided to the first bonding sheet.
Figure 6B:
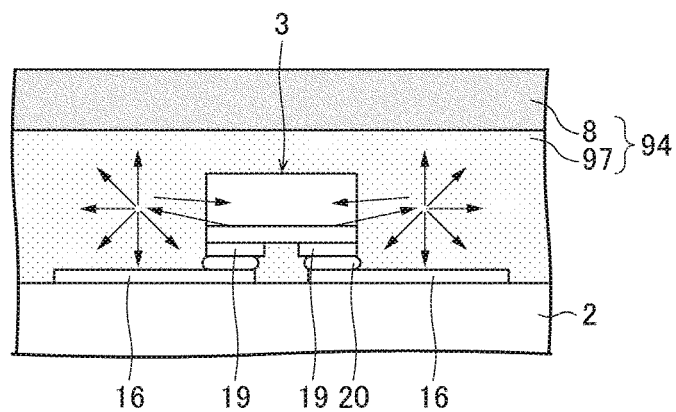
FIG. 6B is a cross-sectional view illustrating a first adhesive layer according to a comparative example.

FIG. 6A is a cross-sectional view for describing the effect of the first adhesive layer 7 provided to the first bonding sheet 4, and FIG. 6B is a cross-sectional view illustrating a first adhesive layer 97 according to a comparative example. Constituent elements similar to the constituent elements described above are given the same reference numerals, and detailed descriptions thereof are not repeated.

Preferably, the first adhesive layer 7 is transparent as much as possible and does not include light diffusing particles or the like. This is because, in a case of the first adhesive layer 97 in which light diffusing particles made from titanium oxide or the like are mixed, although it depends on the concentration of the light diffusing particles, the light emitted from the LED 3 is diffused at or near the LED 3 and re-enters the LED 3 itself, or the light emitted from the LED 3 comes into contact with and is absorbed by an electrode pad 16, the solder 20, and the like having a low reflectivity on the substrate 2. Preferably, the first adhesive layer 7 is transparent as much as possible and the light once emitted from the LED 3 travels far away. Preferably, the first adhesive layer 7 has a haze of 30% or less.

Figure 7A:
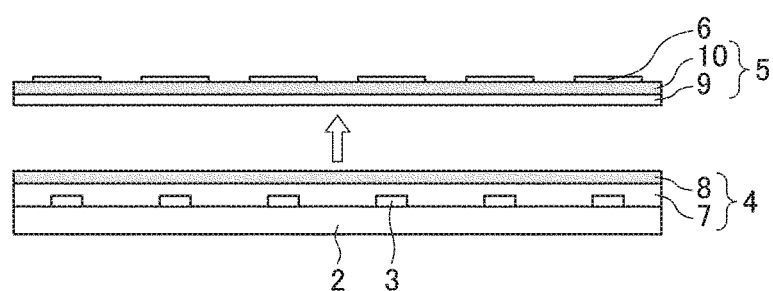
FIG. 7A and FIG. 7B are cross-sectional views for describing an effect of the second bonding sheet.
Figure 7B:
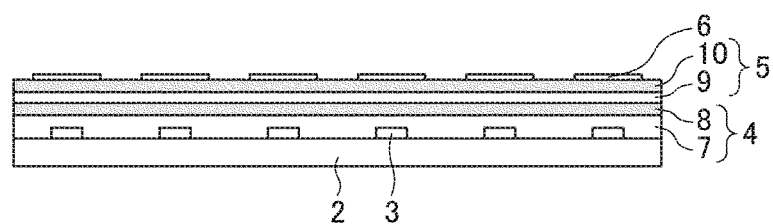

FIG. 7A and FIG. 7B are cross-sectional views for describing effects of the second bonding sheet 5. Constituent elements similar to the constituent elements described above are given the same reference numerals, and detailed descriptions thereof are not repeated.

Given that the reflective layer 6 is formed on the second bonding sheet 5 bonded to the substrate 2 with the first bonding sheet 4 interposed therebetween, there may be manufacturing defects in the reflective layer 6 to some extent during mass production of the LED light-source substrate 1. For example, there are manufacturing defects caused by partial peeling, misalignment, contamination, foreign matter deposition, or the like of the reflective layer 6. The substrate 2 and the LED 3 are expensive, and thus it is desirable to rework the reflective layer 6 in a case where a manufacturing defect occurs in the reflective layer 6. However, the operation of peeling the ink layer and the metal thin film of the reflective layer 6 having the manufacturing defective requires a special chemical solution, and thus such an operation is not practical.

A distinctive feature of the present embodiment is that, by peeling the second bonding sheet 5 from the first bonding sheet 4, the reflective layer 6 having the manufacturing defect can be easily peeled.

In a case where the first bonding sheet 4 is peeled off, the white coating provided by the first adhesive layer 7 of the first bonding sheet 4 on the surface of the substrate 2 may be peeled off, and full or partial peeling (which may cause electrical defect) or LED failure may occur in the LED 3 mounted on the substrate 2, which may lead to failure of the LED light-source substrate 1.

In the present embodiment, only the second bonding sheet 5 that has no effect on the substrate 2 side is peeled, making it possible to easily rework the reflective layer 6 having the manufacturing defect.

Note that after the peeling and disposal of the second bonding sheet 5, a new second bonding sheet 5 is bonded to the first bonding sheet 4, and the reflective layer 6 is reformed on the new second bonding sheet 5.

Second Embodiment

Figure 8A:
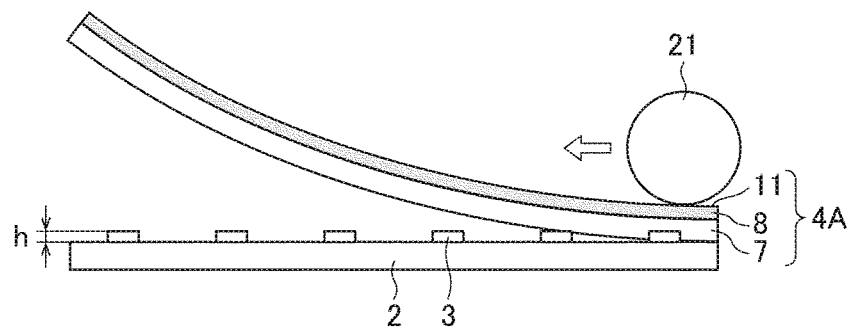
FIG. 8A is a cross-sectional view illustrating a method for forming a first bonding sheet according to a second embodiment.
Figure 8B:
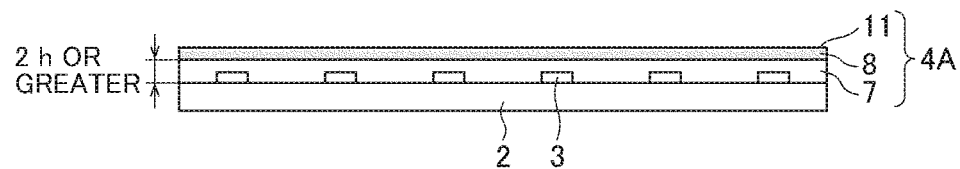
FIG. 8B is a cross-sectional view illustrating the first bonding sheet formed on the substrate according to the second embodiment.
Figure 8C:
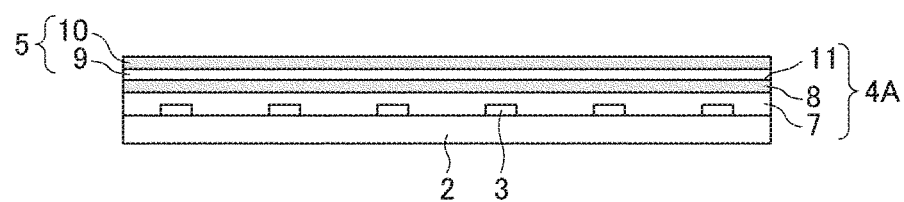
FIG. 8C is a cross-sectional view illustrating the second bonding sheet formed on the first bonding sheet.

FIG. 8A is a cross-sectional view illustrating a method for forming a first bonding sheet 4A according to the second embodiment, FIG. 8B is a cross-sectional view illustrating the first bonding sheet 4A formed on the substrate 2 according to the second embodiment, and FIG. 8C is a cross-sectional view illustrating the second bonding sheet 5 formed on the first bonding sheet 4A. Constituent elements similar to the constituent elements described above are given the same reference numerals, and detailed descriptions thereof are not repeated.

The difference from the first embodiment described above is that the first bonding sheet 4A includes the first adhesive layer 7, the first base material 8 formed on the first adhesive layer 7, and a peeling layer 11 applied to the surface of the first base material 8. Thus, the first bonding sheet 4A includes the peeling layer 11 formed on the second bonding sheet 5 side thereof to make the second bonding sheet 5 peelable from the first bonding sheet 4A.

With this configuration, regardless of the strength of the second adhesive layer 9, the second bonding sheet 5 is easily peelable from the first bonding sheet 4A. Therefore, the ranges of choice of the adhesive materials and the adhesive thicknesses for the second bonding sheet 5 and the first bonding sheet 4A become wider, which is preferable. For example, a silicone-based adhesive having a low adhesive strength is relatively expensive, and thus being able to apply an inexpensive adhesive such as an acrylic-based adhesive to the second adhesive layer 9 without worrying about thickness is very preferable in terms of manufacturing.

Third Embodiment

Figure 9:
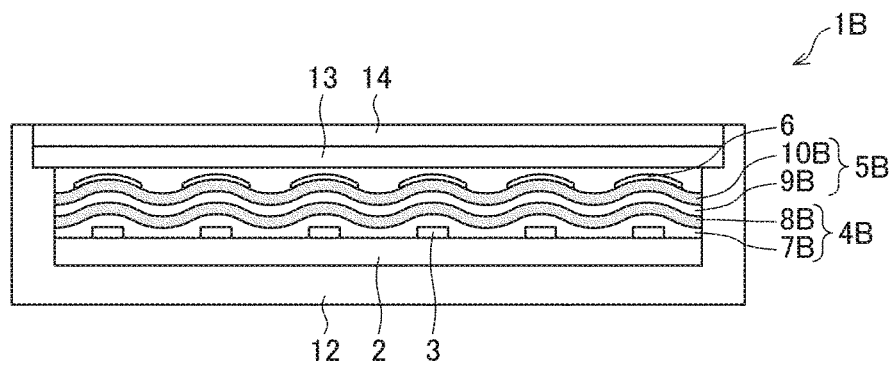
FIG. 9 is a cross-sectional view of the LED light-source substrate according to a third embodiment.

FIG. 9 is a cross-sectional view of an LED light-source substrate 1B according to the third embodiment. Constituent elements similar to the constituent elements described above are given the same reference numerals, and detailed descriptions thereof are not repeated.

The difference from the first embodiment described above is that a first bonding sheet 4B and a second bonding sheet 5B each have a convex shape corresponding to a mounted position of the LED 3.

In the third embodiment, the thickness of the first adhesive layer 7B of the first bonding sheet 4B is controlled to greater than or equal to h and less than or equal to 2h. Further, a thickness of a first base material 8B of the first bonding sheet 4B is controlled to greater than or equal to 12 µm and less than or equal to 200 µm.

A second adhesive layer 9B and a second base material 10B of the second bonding sheet 5 can be freely selected. The first base material 8B has a wave-like shape, and thus the second bonding sheet 5B follows any thickness.

With this configuration, an effect of increasing the light emission efficiency of the LED 3 is also achieved.

However, when the second bonding sheet 5B is bonded to the first bonding sheet 4B, enter of air bubbles may occur when only the roller 21 is used, and thus it is preferable to also use an autoclave.

TABLE 1

| | | Thickness of first adhesive layer 7B | | |
|---|---|---|---|---|
| | | h or less | From h to 2h | 2h or greater |
| Thickness of first base material 8B | 12 µm or less | Poor: Air bubbles remain around bare chip | Marginal: Wrinkles when adhesive layer is formed | Marginal: Light extraction efficiency somewhat improved |

TABLE 1-continued

| | Thickness of first adhesive layer 7B | | |
|---|---|---|---|
| | h or less | From h to 2h | 2h or greater |
| From 12 to 200 μm | Poor: Air bubbles remain around bare chip | Good: High light extraction efficiency | Marginal: Light extraction efficiency somewhat improved |
| 200 μm or greater | Poor: Air bubbles remain around bare chip | Marginal: Light extraction efficiency somewhat improved | Marginal: Light extraction efficiency somewhat improved |

As shown in Table 1 above, it was found that when a thickness of the first adhesive layer 7B of the first bonding sheet 4B is greater than or equal to h and less than or equal to 2h, and the thickness of the first base material 8B is greater than or equal to 12 μm and less than or equal to 200 μm, the first base material 8B deforms following the arrangement form of the LED 3, resulting in a convex shape corresponding to the LED 3 as illustrated in FIG. 9, thereby significantly increasing the light extraction efficiency of the LED 3. When the thickness of the first adhesive layer 7B exceeds 2h, the first base material 8B remains substantially flat regardless of the presence or absence of the LED 3, and thus the effect of improving the light extraction efficiency is limited. Further, also, when the thickness of the first base material 8B exceeds 200 μm, the first base material 8B does not bend and is flat, and thus the effect of improving the light extraction efficiency is limited.

Figure 10A:
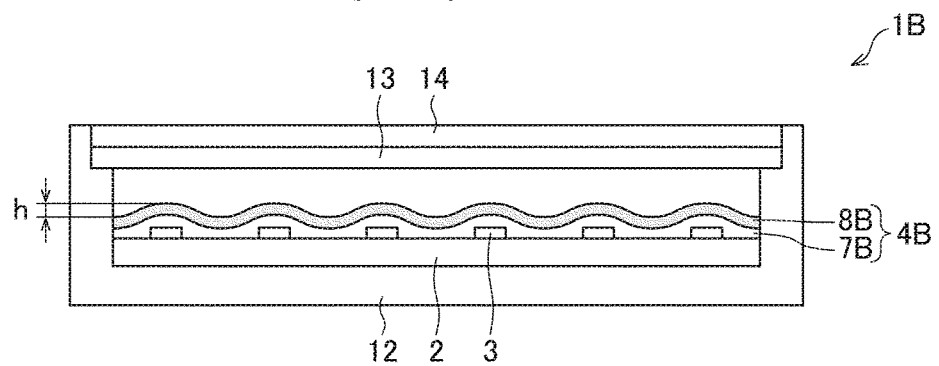
FIG. 10A is a cross-sectional view describing an effect of the LED light-source substrate according to the third embodiment.
Figure 10B:
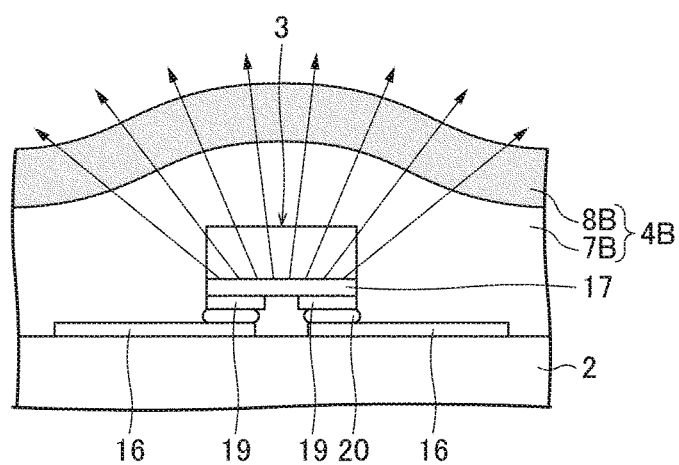
FIG. 10B is a cross-sectional view illustrating a first base material of the first bonding sheet provided to the LED light-source substrate.
Figure 10C:
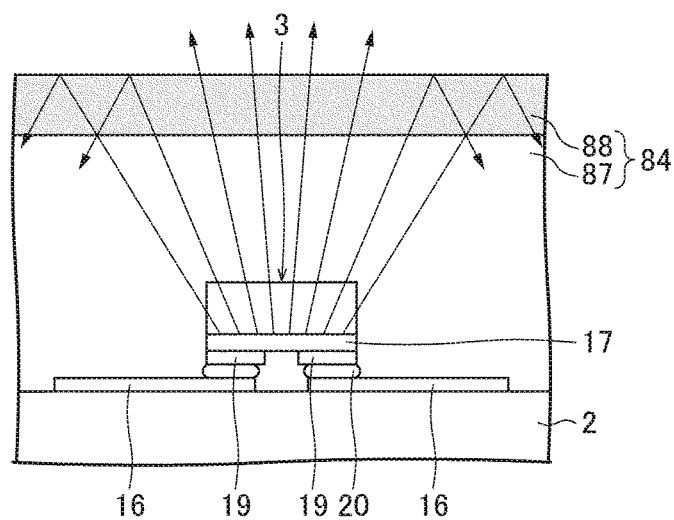
FIG. 10C is a cross-sectional view illustrating a first base material of a first bonding sheet according to a comparative example.

FIG. 10A is a cross-sectional view describing the effect of the LED light-source substrate 1B according to the third embodiment, FIG. 10B is a cross-sectional view illustrating the first base material 8B of the first bonding sheet 4B provided to the LED light-source substrate 1B, and FIG. 10C is a cross-sectional view illustrating the first base material 88 of a first bonding sheet 84 according to a comparative example. Constituent elements similar to the constituent elements described above are given the same reference numerals, and detailed descriptions thereof are not repeated.

When the surface shape of the first base material 8B is convex with the LED 3 being a center thereof, the angle of light incident from the LED 3 changes at an interface between the first base material 8B and the air, causing the light emitted from the LED 3 to emit more readily and the luminous efficiency of the LED 3 to improve. A height of the recesses and protrusions of the surface shape of the first base material 8B is substantially about the height h of the LED 3.

When the first adhesive layer 7B is made thicker, the first base material 8B is made thicker, and the surface shape of the first base material 8B is not convex with the LED 3 being a center thereof, the surface shape of the first base material 8B is flat, and the improvement in efficiency of the LED 3 is limited.

Supplement

An LED light-source substrate 1, 1A, 1B according to a first aspect of the disclosure includes a substrate 2, an LED 3 of a flip-chip type that is mounted on the substrate 2, a first bonding sheet 4, 4A, 4B having transmissivity and formed on the substrate 2 and moreover covering the LED 3, a second bonding sheet 5, 5B having transmissivity and formed on the first bonding sheet 4, 4A, 4B, and a reflective layer 6 formed on the second bonding sheet 5, 5B to suppress light emitted from the LED 3 in a direction orthogonal to the substrate 2. The second bonding sheet 5, 5B is bonded peelably from the first bonding sheet 4, 4A, 4B.

According to the configuration described above, the second bonding sheet can be easily peeled from the first bonding sheet, making it possible to easily rework the reflective layer when a mistake occurs in formation of the reflective layer onto a resin directly above the LED.

In the LED light-source substrate 1, 1A, 1B according to a second aspect of the disclosure, preferably the LED 3 is a bare chip.

According to the configuration described above, the LED is a bare chip, making it possible to reduce the size of the LED light-source substrate.

In the LED light-source substrate 1 according to a third aspect of the disclosure, in the first aspect described above, preferably an adhesive strength of the second bonding sheet 5 relative to the first bonding sheet 4 is weaker than an adhesive strength of the first bonding sheet 4 relative to the substrate 2.

According to the configuration described above, the second bonding sheet can be easily peeled from the first bonding sheet on the basis of a difference in adhesive strength therebetween.

In the LED light-source substrate 1A according to a fourth aspect of the disclosure, in the first aspect described above, preferably the first bonding sheet 4A includes a peeling layer 11 formed on the second bonding sheet 5 side thereof to make the second bonding sheet 5 peelable from the first bonding sheet 4A.

According to the configuration described above, the second bonding sheet can be easily peeled from the first bonding sheet due to the peeling layer.

In the LED light-source substrate 1B according to a fifth aspect of the disclosure, in the first aspect described above, preferably the first and second bonding sheets 4B and 5B each have a convex shape corresponding to a mounted position of the LED 3.

According to the configuration described above, the light emission efficiency of the LED is improved due to an effect of a lens having a convex shape.

In the LED light-source substrate 1, 1A, 1B according to a sixth aspect of the disclosure, in the first aspect described above, preferably the first bonding sheet 4, 4A, 4B includes a first resin layer (first adhesive layer 7, 7B) formed on the substrate 2 and covering the LED 3 and a first base material 8, 8B formed on the first resin layer (first adhesive layer 7, 7B), and the second bonding sheet 5, 5B includes a second resin layer (second adhesive layer 9, 9B) formed on the first base material 8, 8B and a second base material 10, 10B formed on the second resin layer (second adhesive layer 9, 9B).

According to the configuration described above, the periphery around the LED is filled with the first resin layer having a refractive index greater than that of air, and thus the luminous efficiency of the LED is improved.

In the LED light-source substrate 1, 1A, 1B according to a seventh aspect of the disclosure, in the sixth aspect described above, preferably the first resin layer and the second resin layer each include an adhesive layer (first adhesive layer 7, 7B, second adhesive layer 9, 9B).

According to the configuration described above, the periphery around the LED is filled with an adhesive layer, and thus the luminous efficiency of the LED is improved.

In the LED light-source substrate 1, 1A, 1B according to an eighth aspect of the disclosure, in the sixth aspect described above, preferably the first resin layer and the second resin layer (first adhesive layer 7, 7B, second adhesive layer 9, 9B) each have a haze of 30% or less.

According to the configuration described above, light scattering at or near the LED, re-entering of light into the LED, and the like are prevented.

In the LED light-source substrate 1, 1A, 1B according to a ninth aspect of the disclosure, in the sixth aspect described above, preferably the first resin layer and the second resin layer (first adhesive layer 7, 7B, second adhesive layer 9, 9B) each have a refractive index greater than 1.

According to the configuration described above, the luminous efficiency of the LED is improved.

In the LED light-source substrate 1, 1A, 1B according to a tenth aspect of the disclosure, in the sixth aspect described above, preferably the first resin layer (first adhesive layer 7, 7B) includes at least one of an acrylic-based material, an epoxy-based material, and a urethane-based material, and the second resin layer (second adhesive layer 9, 9B) includes a silicone-based material.

According to the configuration described above, the adhesive strength of the second bonding sheet relative to the first bonding sheet can be made weaker than the adhesive strength of the first bonding sheet relative to the substrate.

In the LED light-source substrate 1, 1A, 1B according to an eleventh aspect of the disclosure, in the sixth aspect described above, preferably the second resin layer has an adhesive strength of 5 N/cm or less.

According to the configuration described above, the adhesive strength of the second bonding sheet relative to the first bonding sheet can be made weaker than the adhesive strength of the first bonding sheet relative to the substrate.

In the LED light-source substrate 1, 1A, 1B according to a twelfth aspect of the disclosure, in the first aspect described above, preferably the reflective layer 6 has dimensions greater than or equal to two times and less than or equal to 10 times dimensions of the LED 3.

According to the configuration described above, light emitted from a side surface of the LED can also be reflected by the reflective layer.

In the LED light-source substrate 1, 1A, 1B according to a thirteenth aspect of the disclosure, in the first aspect described above, preferably the reflective layer 6 has a circular shape, and a central axis of the reflective layer 6 is disposed at a position corresponding to a central axis of the LED 3.

According to the configuration described above, light emitted from the LED in all directions can be efficiently shielded.

In the LED light-source substrate 1, 1A, 1B according to a fourteenth aspect of the disclosure, in the sixth aspect described above, preferably the first resin layer (first adhesive layer 7, 7B) has a thickness greater than a thickness of the LED 3.

According to the configuration described above, the LED can be filled with the first resin layer.

In the LED light-source substrate 1B according to a fifteenth aspect of the disclosure, in the fifth aspect described above, preferably the convex shape has a height substantially equal to a thickness of the LED 3.

According to the configuration described above, the first and second bonding sheets can be formed along an outer shape of the LED.

An illumination device according to a sixteenth aspect of the disclosure includes the LED light-source substrate 1, 1A, 1B according to any one of the first to fifteenth aspects described above.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LED light-source substrate comprising:
   a substrate;
   an LED of a flip-chip type that is mounted on the substrate;
   a first bonding sheet having transmissivity and formed on the substrate and moreover covering the LED;
   a second bonding sheet having transmissivity and formed on the first bonding sheet; and
   a reflective layer formed on the second bonding sheet to suppress light emitted from the LED in a direction orthogonal to the substrate,
   wherein the second bonding sheet is bonded peelably from the first bonding sheet.

2. The LED light-source substrate according to claim 1, wherein the LED is a bare chip.

3. The LED light-source substrate according to claim 1, wherein an adhesive strength of the second bonding sheet relative to the first bonding sheet is weaker than an adhesive strength of the first bonding sheet relative to the substrate.

4. The LED light-source substrate according to claim 1, wherein the first bonding sheet includes a peeling layer formed on the second bonding sheet side thereof to make the second bonding sheet peelable from the first bonding sheet.

5. The LED light-source substrate according to claim 1, wherein the first bonding sheet and the second bonding sheet each have a convex shape corresponding to a mounted position of the LED.

6. The LED light-source substrate according to claim 1, wherein the first bonding sheet includes a first resin layer formed on the substrate and covering the LED, and a first base material formed on the first resin layer, and the second bonding sheet includes a second resin layer formed on the first base material and a second base material formed on the second resin layer.

7. The LED light-source substrate according to claim 6, wherein the first resin layer and the second resin layer each include an adhesive layer.

8. The LED light-source substrate according to claim 6, wherein the first resin layer and the second resin layer each have a haze of 30% or less.

9. The LED light-source substrate according to claim 6, wherein the first resin layer and the second resin layer each have a refractive index greater than 1.

10. The LED light-source substrate according to claim 6, wherein the first resin layer includes at least one of an acrylic-based material, an epoxy-based material, and a urethane-based material, and
the second resin layer includes a silicone-based material.

11. The LED light-source substrate according to claim 6, wherein the second resin layer has an adhesive strength of 5 N/cm or less.

12. The LED light-source substrate according to claim 1, wherein the reflective layer has dimensions greater than or equal to two times and less than or equal to 10 times dimensions of the LED.

13. The LED light-source substrate according to claim 1, wherein the reflective layer has a circular shape, and
a central axis of the reflective layer is disposed at a position corresponding to a central axis of the LED.

14. The LED light-source substrate according to claim 6, wherein the first resin layer has a thickness greater than a thickness of the LED.

15. The LED light-source substrate according to claim 5, wherein the convex shape has a height substantially equal to a thickness of the LED.

16. An illumination device comprising the LED light-source substrate described in claim 1.

* * * * *